US005959556A

United States Patent [19]

Shrader et al.

[11] Patent Number: 5,959,556

[45] Date of Patent: Sep. 28, 1999

[54] JOYSTICK CONTROLLER

[76] Inventors: Michael C. Shrader, 706 Farfields Dr., Lynchburg, Va. 24502; Michael Frazier, 107 Shady Oak La., Forest, Va. 24551-1111

[21] Appl. No.: 08/955,600

[22] Filed: Oct. 22, 1997

[51] Int. Cl.[6] .................................................. H03K 17/94

[52] U.S. Cl. ...................... 341/20; 200/6 R; 74/471 XY; 74/519; 273/148 B; 345/161

[58] Field of Search ....................... 341/20, 21; 345/157, 345/161; 200/6 R, 6 A; 74/471 XY, 491, 519, 520; 273/148 B, 150

[56] References Cited

U.S. PATENT DOCUMENTS

| | | | |
|---|---|---|---|
| 3,629,775 | 12/1971 | Kindred | 74/519 |
| 5,134,395 | 7/1992 | Stern | 345/161 |
| 5,451,983 | 9/1995 | Poivet | 345/161 |
| 5,786,808 | 7/1998 | Khoury | 345/161 |
| 5,874,944 | 2/1999 | Khoury | 345/161 |

*Primary Examiner*—Michael Horabk
*Assistant Examiner*—Timothy Edwards, Jr.

[57] ABSTRACT

A process and an adjustable circuit using a joystick activated controller constructed in accordance with the principles of the present invention to provide balanced forward and reverse directional regulation of bidirectional motors oppositely deployed to cooperation in the propulsion of an item of equipment. The joystick responds to the hand of a human operator to regulate the operation of a pair of motors driving opposite sides of an item of equipment along a path of travel. By operating the joystick, the operator can adjust the speed and the forward and reverse directions while trimming the motors or actuators to allow the piece of construction equipment to travel a straight path, or alternatively, to enable the operator to toggle the joystick to guide the equipment during its operational performance, along a path of varied direction.

12 Claims, 2 Drawing Sheets

JOYSTICK CONTROLLER

THE BACKGROUND OF THE INVENTION

1. Field of the Invention

The present invention is generally related to joystick controllers, and, more particularly, to processed and apparatus enabling accurate remote control of the operation of machinery.

2. Description of the Background Art

Typically, machinery has required the continuous hands-on attention of a human operator, a requirement that has been alleviated to some degree for stationary machinery by the advent of numerically controller and microprocessor based controllers. Other items of stationary equipment and construction equipment continue to require the presence of a human operator to continually monitor and adjust the path, direction and rate of travel of the equipment during its operation. Irregularities in the surface and texture of the work for example, can deleteriously influence whether the equipment is able to follow a true path during its operation. Moreover, with self propelled equipment, operator discomfort and subsequent fatigue concomitant to the operator's close proximity to the site of work being operated upon by the equipment lowers the quality of the work as a function of time. Consequently, where the quality of the work (e.g., earth moving) will tolerate a relatively low degree of accuracy and the cost or complexity of a control system will substantially increase the initial cost of the equipment, it is often more economical to rely upon a human operator to control and guide the equipment.

SUMMARY OF THE INVENTION

It is an object of the present invention is to provide an improved process and apparatus for control the operation of machinery.

It is another object to provide a process and controller able to remotely regulate the path of travel of an item of self propelled construction machinery.

It is yet another object to provide a process and controller able to regulate the rate of travel of an item of self propelled construction machinery.

It is still yet another object to provide a process and controller responsive to a joystick to remotely control a pair of motors or actuators and remotely regulate the operation of an item of construction equipment, such as a ditch digger.

These and other objects may be achieved with a process and an adjustable circuit using a joystick activated controller constructed in accordance with the principles of the present invention to provide balanced forward and reverse directional regulation of bidirectional motors oppositely deployed to cooperation in the propulsion of an item of equipment. A balanced, bidirectional controller able to use a single battery to provide bidirectional operation while providing adjustable gain uses a joystick having a first pair of variable resistors coupled in series between a battery terminal and a ground terminal to form a first node. The controller has two circuits with constructed with a pair of contact wipers are coupled to different ones of the pair of variable resistors, and a manually operable toggle is connected to the pair of contact wipers. The toggle is manually positionable to vary potential differences between both of the individual contact wipers and the ground terminal. An adjustable voltage divider has a third contact wiper providing a first adjustable potential. A first operational amplifier has a pair of input ports separately coupled to the first one of the pair of contact wipers and the third contact wiper, and an output port connectable to a first side of one of a pair of electrically responsive bidirectional motor propelling the piece of equipment. An adjustable resistor is coupled in series with a first diode exhibiting a first polarity, between the output port of the first operational amplifier and a first one of the input ports of the first operational amplifier, and a second adjustable resistor is coupled in series with a second diode exhibiting a second and opposite polarity, between the output port of the first operational amplifier and the first one of the pair of input ports of the first operational amplifier. A voltage follower stage is constructed with a second operational amplifier having a first input port coupled to the first node, and output port coupled to a second side of the electrically responsive motor.

The joystick responds to the hand of a human operator to regulate the operation of a pair of motors driving opposite sides of an item of equipment along a path of travel. By operating the joystick, the operator can adjust the speed and the forward and reverse directions while trimming the motors or actuators to allow the piece of construction equipment to travel a straight path, or alternatively, to enable the operator to toggle the joystick to guide the equipment during its operational performance, along a path of varied direction.

BRIEF DESCRIPTION OF THE DRAWING

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 1:
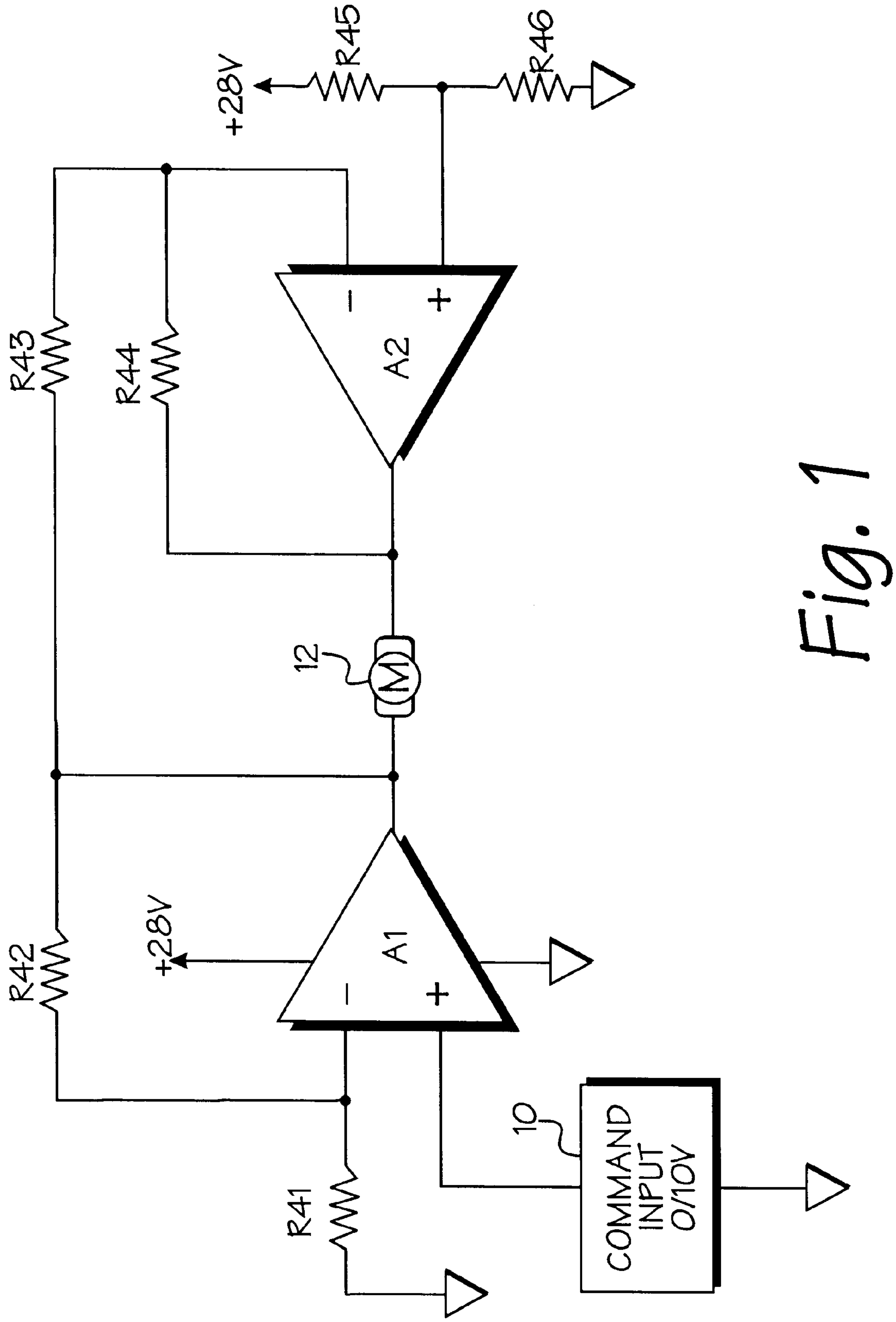
FIG. 1 is a circuit schematic of a motor actuator.

FIG. 1 shows a circuit using operational amplifiers A1, A2 having output ports coupled directly to opposite sides of a twenty-four volt bidirectional motor 20, to provide bidirectional control of the speed of motor 20. This circuit, described in a technical manual published by Apex Microtechnology Corporation, is powered by a single twenty-eight volt power supply. A the central node of a voltage divider formed by serially coupled resistors R45, R46 is coupled to the non-inverting input port of amplifier A2. Resistors R45, R46 are coupled between a twenty-eight volt source and a ground potential. A command potential varying in amplitude between zero and ten volts is applied by controller 10 to the non-inverting input port of amplifier A1, while the inverting port of amplifier A1 is connected via resistor R41 to the ground potential. Resistor R42 is coupled between the inverting input port of amplifier A1 and the output port of amplifier A1. Resistor R44 is coupled between the inverting input port of amplifier A2 and the output port of amplifier A2, while resistor R43 is coupled between the inverting input port of amplifier A2 and the output port of amplifier A1.

Ostensibly, this circuit provides an extended common mode range that allows command inputs as low as zero volts by controller 10. We have found however, that this circuit does not enable joystick control.

Figure 2:
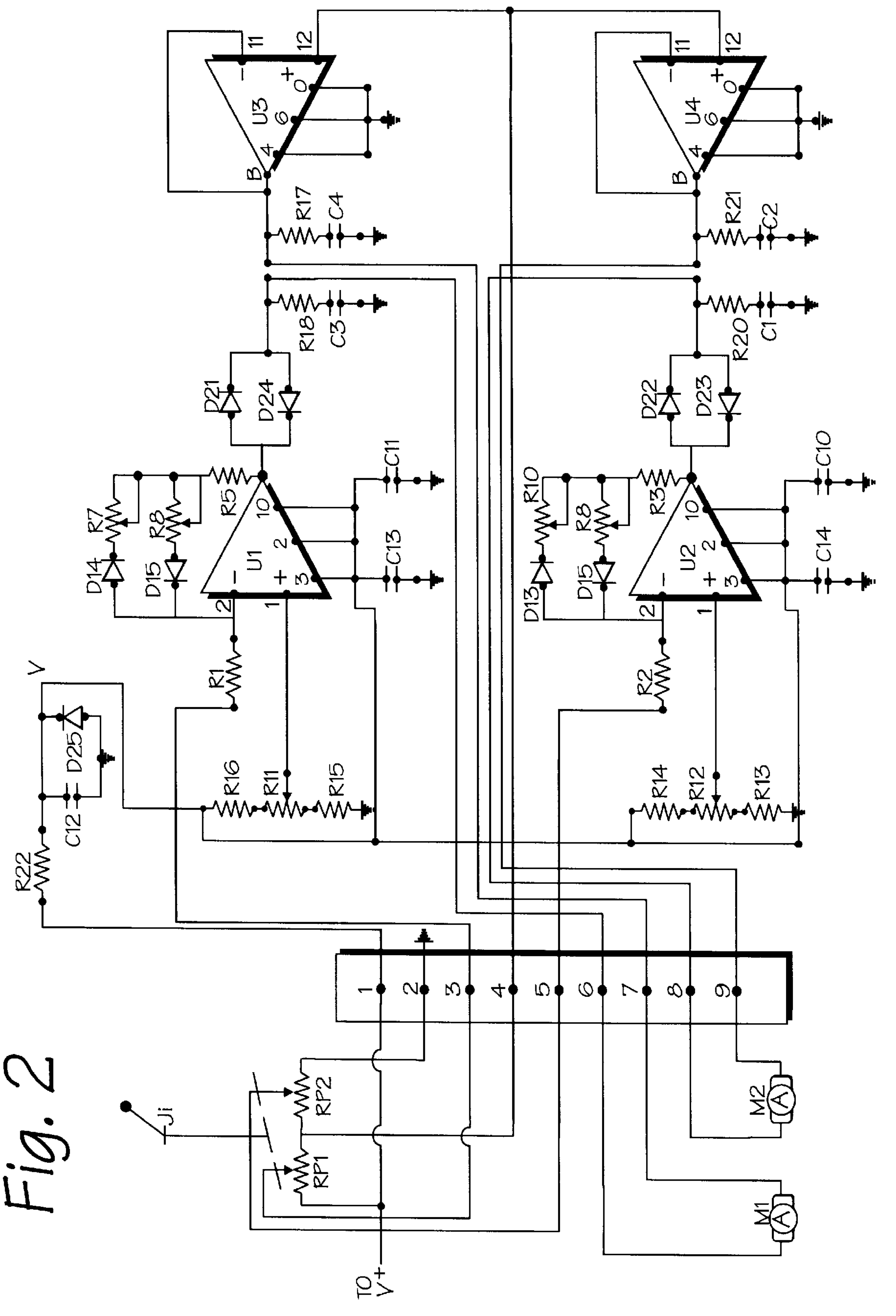
FIG. 2 is a circuit schematic of a joystick controller connected to the joystick and the pair of motors in accordance with the principles of the present invention.

Turning now to FIG. 2, the circuit diagram illustrates a joystick activated controller constructed in accordance with the principles of the present invention. Note that the remotely operated joystick can be any commercially available joystick such as those used for aerospace or video game applications. In view of the adverse environment in which the joystick will likely be operated, an inductive type joystick would be preferable to a direct connection potentiometer type.

It is apparent from looking at the circuit diagram that the left and right channels of the joystick controller are identical and accordingly, only the upper channel would be discussed in detail. A source of power B+ is connected between terminals 1 and 2 of the terminal board TB1. Depending on the specific types of motors and operational amplifiers selected, this voltage can be from 5 to 40 volts direct current and commonly 12 volts direct current such as provided by the lead acid storage battery of the item of self propelled construction equipment, would be preferably used.

The B+ voltage entering on pin 1 of the terminal board TB1 is first regulated and filtered by a voltage regulator formed by resistor R22, capacitor C12 and Zener diode D25 to produce a regulated voltage that exhibits a magnitude that is somewhat less than the input voltage B+. This voltage B is supplied to the operational amplifiers U1, U2 used to drive electric, or alternatively electrically operated hydraulic, bidirectional motors M1 and M2 controlling the operation (e.g., driving the left and right axles of the chassis of a ditch digger in order to propel the ditch digger in forward and reverse directions along a path of travel). Alternatively, bidirectional motors M1, M2 are reciprocating solenoids exhibiting a central null during the absence of any applied voltage, and exhibiting forward, or reverse travel in response to the polarity of the applied voltage. Joystick Ji has two potentiometers RP1, RP2 that are connected between the voltage B+ and a local reference potential such as a circuit ground. The output across potentiometer RP1 is fed through terminal 3 of the terminal block to one channel while the output across potentiometer RP2 is fed through terminal 5 to a second channel. Operational amplifier U1 receives the output of potentiometer RP1 through input resistor R1, on pin 2 of the operation amplifier U1; pin 2 is the inverting input port of amplifier U1. The non-inverting input port of operational amplifier U1 is connected to a voltage divider formed by serially connected resistors R16, R11 and R15. Resistor R11 is a variable resistor such that the voltage of the non-inverting input terminal of operational amplifier U1 may be adjusted over an appropriate range. Alternatively, in a particularly application, a single fixed resistor may be substituted for resistors R11, R15 and R16. Normally, resistor R11 is adjusted while joystick Ji is in a neutral position where the output of operational amplifier U1 causes motor M1 to be stationary and centered.

A feedback path for operational amplifier U1 is formed with parallel paths between the output port of amplifier U11 and the inverting port, by a pair of variable resistors R7 and R6, each coupled in series with corresponding diodes D14 and D15 respectively, coupled back-to-back in opposite polarity. Resistor R7 controls the gain of the operational amplifier U1 when the diode D14 is conducting; that is when the output of operational amplifier U1 is negative. Variable resistor R6 controls the gain of operational amplifier U1 when diode D15 is conducting; that is, when the output of operational amplifier U1 is positive. Resistor R5 is coupled in series between the output port of amplifier U1 and the two parallel feedback paths through resistors R7 and R6, to set a minimum gain value for the operational amplifier U1.

Back to back diodes D21 and D24 are coupled between the output port of operational amplifier U1 and one side of motor M1 via terminal 6 of the terminal block to provide a hysteresis effect at low output voltage levels in order to avoid "hunting" by the motor M1. Additionally, serially coupled pairs of resistor R18 and capacitor C3, and resistor R17 and capacitor C4 are provided to add jumping to the system and to thereby prevent motor oscillation.

In operation, the variable voltage output from potentiometer RP1 in response to manipulation of the contract wiper of resistor RP1 in response to the hand of the human operator on joystick Ji, is fed to an input port amplifier U1 which, in turn, generates an output voltage that is applied to one terminal of the motor M1. The node between potentiometer RP1 and RP2 is connected via terminal 4 of the terminal block to the non-inverting port of another operational amplifier U3. The output port of operational amplifier U3 is coupled to the inverting input port in order to configure amplifier U3 as a voltage follower. The output port of operational amplifier U3 is coupled via terminal 7 to the opposite side of motor M1.

Initially, when the system is first used, the operator manually positions joystick Ji into its center neutral position and the resistors R11 and R12 are adjusted so that the motors M1 and M2 are in their neutral position. Joystick J1 is then manually placed in the maximum position in one direction and one of resistors R7 or R6, depending on which diode D14 or D15 is then conducting, is adjusted to give the maximum output value (e.g., shaft speed) of motor M1 corresponding to that direction. Subsequently, the operator moves joystick Ji to the maximum position in the opposite direction and other one of the two resistor R7 and R6 is adjusted to adjust the maximum speed of the motor M1 in the opposite direction.

Note that the voltage at the node forming the junction between potentiometers RP1 and RP2 is fed via terminal 4 of the terminal block to the operational amplifiers U3 and U4, operating as voltage followers, and the output signals generated at the output ports of amplifiers U3, U4 are fed via terminals 7, 9 respectively, to the second terminals of the motors M1 and M2. By using the voltage followers U3 and U4, the system can operate while utilizing a single voltage supply rather than requiring both a positive and negative voltage supply, thereby greatly simplifying the powering of the circuit.

After all of the valuable resistors have been set, they would normally not need further adjustment unless there was a substantial change and the environment or when a component was replaced. The joystick may then be used to operate motors M1 and M2 to control the movement of the piece of construction equipment such as a ditch digger, to allow the operator to remotely, continuously control the ditch digger from a conveniently located remote location, thereby allowing safe and an efficient operation of the ditch digger while the operator is sited in a moderate degree of comfort safely away from the dirt, noise and danger attendant to the operation of the ditch digger.

It may be seen that the process and circuit described in the details of the foregoing paragraphs enables control of machinery such as a piece of construction equipment, a ditch digger for example, with a joystick, and thereby regulating the operation of oppositely oriented motors, bidirectionally positionable solenoids, or electrically powered actuators, to direct the path of travel followed by the machinery, for example.

What we claim is:

1. A controller, comprising:

a joystick comprised of a first pair of variable resistors coupled in series between a battery terminal and a reference terminal to form a first node, a pair of contact wipers coupled to different ones of said first pair of variable resistors, a toggle connected to said pair of contact wipers and manually positionable to conjointly vary potential differences between individual ones of said pair of contact wipers and said reference terminal;

a first adjustable voltage divider having a third contact wiper providing a first adjustable potential;

a voltage regulator coupled between said battery terminal and said first voltage divider;

a first operational amplifier having a pair of input ports separately coupled to said a first one of said pair of contact wipers and said third contact wiper, and an output port connectable to a first side of an electrically responsive motor;

a first adjustable resistor coupled in series with a first diode exhibiting a first polarity, between said output port of said first operational amplifier and a first one of said pair of input ports of said first operational amplifier;

a second adjustable resistor coupled in series with a second diode exhibiting a second and opposite polarity, between said output port of said first operational amplifier and said first one of said pair of input ports of said first operational amplifier; and a voltage follower comprised of a second operational amplifier having a first input port coupled to said first node, and output port coupled to a second side of the electrically responsive motor, and a second input port coupled to said output port of said second operational amplifier.

2. The circuit of claim 1, further comprised of a pair of back-to-back diodes electrically interposed in series between said output port of said first operational amplifier and the first side of the motor.

3. The circuit of claim 1, further comprised of:

a first resistance serially coupled with a first capacitance between said output port of said first operational amplifier and said reference terminal; and a second resistance serially coupled with a second capacitance between said output port of said second operational amplifier and said reference terminal.

4. The circuit of claim 2, further comprised of a pair of back-to-back diodes electrically interposed in series between said output port of said first operational amplifier and said first resistance.

5. The circuit of claim 1, further comprised of:

a second adjustable voltage divider having a fourth contact wiper providing a second adjustable potential;

a third operational amplifier having a pair of input ports separately coupled to said a second one of said pair of contact wipers and said fourth contact wiper, and an output port connectable to a first side of a second motor;

a third adjustable resistor coupled in series with a third diode exhibiting said first polarity, between said output port of said second operational amplifier and a first one of said pair of input ports of said third operational amplifier;

a fourth adjustable resistor coupled in series with a fourth diode exhibiting said second and opposite polarity, between said output port of said third operational amplifier and said first one of said pair of input ports of said third operational amplifier; and a second follower comprised of a fourth operational amplifier having a first input port coupled to said first node, and output port coupled to a second side of the second motor, and a second input port coupled to said output port of said second operational amplifier.

6. The circuit of claim 5, further comprised of a pair of back-to-back diodes electrically interposed in series between said output port of said third operational amplifier and the first side of the second motor.

7. The circuit of claim 5, further comprised of:

a first resistance serially coupled with a first capacitance between said output port of said third operational amplifier and said reference terminal; and a second resistance serially coupled with a second capacitance between said output port of said fourth operational amplifier and said reference terminal.

8. The circuit of claim 6, further comprised of a pair of back-to-back diodes electrically interposed in series between said output port of said third operational amplifier and said first resistance.

9. A controller, comprising:

a joystick comprised of a first pair of variable resistors coupled in series between a battery terminal and a reference terminal to form a first node, a pair of contact wipers coupled to different ones of said first pair of variable resistors, a toggle connected to both of said pair of contact wipers and manually positionable to vary potential differences between individual ones of said pair of contact wipers and said reference terminal;

a first adjustable voltage divider having a third contact wiper providing a first adjustable potential;

a first operational amplifier having a pair of input ports separately coupled to said a first one of said pair of contact wipers and said third contact wiper, and an output port connectable to a first side of an electrically responsive bidirectional motor;

a first adjustable resistor coupled in series with a first diode exhibiting a first polarity, between said output port of said first operational amplifier and a first one of said pair of input ports of said first operational amplifier;

a second adjustable resistor coupled in series with a second diode exhibiting a second and opposite polarity, between said output port of said first operational amplifier and said first one of said pair of input ports of said first operational amplifier;

a second operational amplifier having a first input port coupled to said first node, and output port coupled to a second side of the electrically responsive motor, and a second input port coupled to said output port of said second operational amplifier;

a second adjustable voltage divider having a fourth contact wiper providing a second adjustable potential;

a third operational amplifier having a pair of input ports separately coupled to said a second one of said pair of contact wipers and said fourth contact wiper, and an output port connectable to a first side of a second electrically responsive bidirectional motor;

a third adjustable resistor coupled in seres with a third diode exhibiting said first polarity, between said output port of said second operational amplifier and a first one of said pair of input ports of said third operational amplifier;

a fourth adjustable resistor coupled in series with a fourth diode exhibiting said second and opposite polarity, between said output port of said third operational amplifier and said first one of said pair of input ports of said third operational amplifier; and a fourth operational amplifier having a first input port coupled to said first node, and output port coupled to a second side of the second motor, and a second input port coupled to said output port of said fourth operational amplifier.

10. The circuit of claim 9, further comprised of a pair of back-to-back diodes electrically interposed in series between said output port of said third operational amplifier and the first side of the motor.

11. The circuit of claim 9, further comprised of:

a first resistance serially coupled with a first capacitance between said output port of said third operational amplifier and said reference terminal; and a second resistance serially coupled with a second capacitance between said output port of said fourth operational amplifier and said reference terminal.

12. The circuit of claim 11, further comprised of a pair of back-to-back diodes electrically interposed in series between said output port of said third operational amplifier and said first resistance.

* * * * *